(12) United States Patent
Deak et al.

(10) Patent No.: US 9,599,693 B2
(45) Date of Patent: Mar. 21, 2017

(54) MAGNETOMETER WITH DUAL PURPOSE RESET AND CALIBRATION COIL

(71) Applicant: Multidimension Technology Co., Ltd., Zhangjiagang (CN)

(72) Inventors: James Geza Deak, Zhangjiagang (CN); Weifeng Shen, Zhangjiagang (CN); Xiaofeng Lei, Zhangjiagang (CN); Songsheng Xue, Zhangjiagang (CN)

(73) Assignee: MultiDimension Technology Co., Ltd., Zhangjiagang Jiangsu (CN)

( * ) Notice: Subject to any disclaimer, the term of this patent is extended or adjusted under 35 U.S.C. 154(b) by 322 days.

(21) Appl. No.: 14/356,603

(22) PCT Filed: Sep. 26, 2012

(86) PCT No.: PCT/CN2012/082015
§ 371 (c)(1),
(2) Date: May 7, 2014

(87) PCT Pub. No.: WO2013/067865
PCT Pub. Date: May 16, 2013

(65) Prior Publication Data
US 2014/0300348 A1   Oct. 9, 2014

(30) Foreign Application Priority Data

Nov. 11, 2011   (CN) .......................... 2011 1 0356226

(51) Int. Cl.
*G01R 33/09*   (2006.01)
*G01R 35/00*   (2006.01)
*G01R 33/00*   (2006.01)

(52) U.S. Cl.
CPC ......... *G01R 35/005* (2013.01); *G01R 33/007* (2013.01); *G01R 33/0017* (2013.01); *G01R 33/0035* (2013.01)

(58) Field of Classification Search
CPC ...................................................... G01R 35/00
(Continued)

(56) References Cited

U.S. PATENT DOCUMENTS 7,855,555 B2   12/2010   Biziere et al.
8,237,436 B2   8/2012   Boeve et al.
(Continued)

FOREIGN PATENT DOCUMENTS

CN   101044412 A   9/2007
CN   101427157 A   5/2009
(Continued)

OTHER PUBLICATIONS

"International Application Serial No. PCT/CN2012/082015, International Preliminary Report on Patentability dated May 13, 2014", (w/ English Translation), 15 pgs.
(Continued)

*Primary Examiner* — Bot Ledynh
(74) *Attorney, Agent, or Firm* — Schwegman Lundberg & Woessner, P.A.

(57) ABSTRACT

The present invention discloses a magnetic field sensing device that utilizes a single coil for calibrating the response of the sensor to compensate for temperature dependent sensitivity drift and also for resetting the magnetic field sensor in order to eliminate hysteresis. The single coil configuration is advantageous since it reduces the size of the sensor chip by decreasing the number of contact pads on the chip and also because it wastes less space, which permits an increase in the density of the magnetoresistive elements on the sensor chip.

20 Claims, 7 Drawing Sheets

(58) Field of Classification Search
USPC .................................................. 324/202, 252
See application file for complete search history.

(56) References Cited

U.S. PATENT DOCUMENTS

| | | |
|---|---|---|
| 2003/0117254 A1 | 6/2003 | Wan et al. |
| 2009/0072815 A1 | 3/2009 | Kahlman et al. |
| 2009/0108841 A1 | 4/2009 | Abe et al. |
| 2010/0013471 A1* | 1/2010 | Boeve et al. ............... 324/252 |
| 2010/0026288 A1 | 2/2010 | Sauber et al. |
| 2011/0169488 A1 | 7/2011 | Mather |

FOREIGN PATENT DOCUMENTS

| | | |
|---|---|---|
| CN | 101611327 A | 12/2009 |
| CN | 102540113 A | 7/2012 |
| CN | 202372636 U | 8/2012 |
| DE | 19740408 | 3/1998 |
| DE | 102010028390 | 11/2011 |
| EP | 0544479 | 6/1993 |
| FR | 2876800 | 4/2006 |
| WO | WO-9909427 | 2/1999 |
| WO | WO-2010143718 | 12/2010 |
| WO | WO-2013/067865 A1 | 5/2013 |

OTHER PUBLICATIONS

"International Application Serial No. PCT/CN2012/082015, International Search Report mailed Jan. 3, 2013", (w/ English Translation), 5 pgs.

"International Application Serial No. PCT/CN2012/082015, Written Opinion mailed Jan. 3, 2013", (w/ English Abstract), 13 pgs.

"European Application No. 12847626.4, Response to Supplementary European Search Report dated Jul. 21, 2016", (Jul. 21, 2016), 7 pgs.

"European Application No. 12847626.4, Supplementary European Search Report dated Jan. 11, 2016", (Jan. 11, 2016), 12 pgs.

* cited by examiner

MAGNETOMETER WITH DUAL PURPOSE RESET AND CALIBRATION COIL

CROSS-REFERENCE TO A RELATED APPLICATION

This application is a 35 U.S.C. §371 national phase application of PCT/CN2012/082015, filed on Sep. 26, 2012, which claims priority to a Chinese Patent Application No. CN 201110356226, filed on Aug. 30, 2011, incorporated herein by reference in its entirety.

FIELD OF THE INVENTION

This invention relates to a magnetic field sensing device.

BACKGROUND OF THE INVENTION

Magnetic sensors are widely used in modern systems to measure or detect physical parameters including but not limited to magnetic field strength, current, position, motion, orientation, and so forth. There are many different types of sensors in the prior art for measuring magnetic field, but these sensors have limitations that are well known in the art, such as, excessive size, inadequate sensitivity and/or dynamic range, cost, reliability and other factors.

Hence, there is a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high performance MTJ linear magnetic field sensors have not been adequately developed. In particular, performance issues due to temperature dependence and hysteresis are not easy to control.

Magnetic field sensors may be constructed from a single magnetoresistive element, but in practice it is advantageous to configure several magnetoresistive elements into a Wheatstone bridge in order to eliminate offset, increase sensitivity, and provide some level of temperature compensation. Although bridge configurations do improve temperature compensation, the inherent temperature dependence of the magnetoresistance and magnetic properties of the sensor are not completely suppressed. For high accuracy, it is desirable to calibrate the sensitivity during operation, and an on-chip calibration coil that produces a known magnetic field along the sensitive direction of the sensor is often provided for this purpose. Calibration is often performed by periodically applying a low amplitude current pulse sequence to the calibration coil, which provides a known magnetic field pulse sequence from which the sensitivity of the magnetoresistive sensor may be determined during operation of the magnetometer.

Because magnetoresistive sensors are composed of ferromagnetic sensing elements, the sensor response is subject to nonlinearities, offset, and hysteresis due to the formation and motion of domain walls within the sensor elements or other components, such as magnetic shields and flux concentrators. To overcome this issue, high performance magnetoresistive sensors are often provided with another coil, orthogonal to the calibration coil that is used to periodically saturate the sensor elements and sweep out magnetic domains. This is referred to as a set/reset coil.

The presence of both the calibration and set/reset coils adds complexity to magnetoresistive sensor fabrication by increasing the number of process steps required to manufacture the sensor, and it increases the size of the sensor die by requiring more contact pads and to accommodate the geometrical constraints required to produce the orthogonal calibration and set/reset fields.

Magnetoresistive sensors without a calibration coil are possible. A disadvantage of this approach is the fact that the sensitivity of the sensor cannot be measured by electrical means. That is, if the magnetoresistive sensor does not have a calibration coil, the response of the sensor cannot be monitored and analyzed for sensitivity. Moreover, implementing a standard self-test in the sensor is cumbersome.

The magnetic field that is generated by a line current decreases inversely proportionally with the distance from the line. Power optimization indicates that the distance between the sensor and the calibration coil, and the distance between the sensor and the reset coil should be as small as possible. Ideally both coils should be located as close as possible to the sensor. This is however physically impossible.

SUMMARY OF THE INVENTION

The present invention provides a method for mass production of linear magnetoresistive sensor bridges using a simplified coil design. The disclosed sensor uses MTJ or giant magnetoresistive (GMR) elements combined with a single on-chip coil for the calibration and set/reset operations. The magnetometer uses a low unipolar or bipolar current pulse cycle for the calibration operation, and a large unipolar current pulse for the reset operation.

The present invention discloses a magnetic field sensing device, including magnetoresistive sensing elements, wherein the coercivity of said sensing elements is equal to the offset field of the sensing elements, a coil placed near said magnetoresistive sensing elements, which generates a magnetic field parallel to the sensing axis of said magnetoresistive elements, and a first current through the coil is used to reset the sensing elements while a second current is used to calibrate the response of the sensing elements.

Preferably, said first current through the coil is greater than said second current.

Preferably, said first and second currents are in the range of 1 to 10 mA.

Preferably, said coil is a single conductive layer.

Preferably the coil is a meander shape.

Alternatively, the coil is a spiral shape.

The sensor may be used as a compass.

In another implementation, the magnetic sensor includes a magnetic sensing element that has coercivity equal to its offset field is located close to a coil, and the coil generates a first magnetic field parallel to the sensing axis of the magnetoresistive sensor and a second magnetic field component perpendicular to the sensing axis of the magnetoresistive sensor, wherein the first magnetic field component is greater than the second magnetic field component, said first magnetic field component is sued for set/reset and calibration functions and said second magnetic field component is used to properly align domains at the edges of the magnetoresistive sensor elements, and further a first current through the coil is used for the set/reset function, and a second current is used for calibration of the magnetoresistive sensing element.

Preferably, said first current through the coil is greater than said second current.

Preferably, said first and second currents are in the range of 1 to 10 mA.

Preferably, the angle between the current direction and the long axis of the magnetoresistive sensing element is less than or equal to 22.5°.

Preferably, said coil is a single conductive layer.

Preferably the coil is a meander shape.

Alternatively, the coil is a spiral shape.

The sensor may be used as a compass.

DETAILED DESCRIPTION OF EXEMPLARY EMBODIMENTS

The invention relates to an electronic device with a high accuracy magnetoresistive sensor to be used in low cost and possibly low power applications. Low-power sensors are particularly interesting for mobile electronic devices such as mobile telephones, watches, portable computers, or personal touch screen devices, etc. In particular, magnetoresistive sensors can be used to implement an electronic compass in order to provide a navigational reference with respect to the earth's magnetic field.

Figure 1:
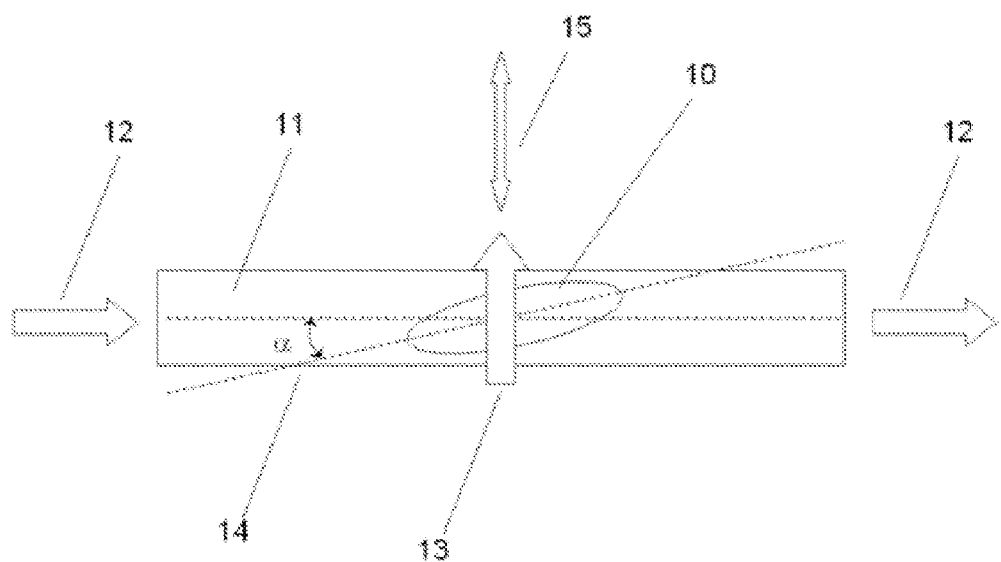
FIG. 1—Schematic drawing of the configuration of s sensor element and coil.

FIG. 1 illustrates the simplified concept of the sensing element and coil geometry. Here, a magnetoresistive sensor element 10 sits atop or beneath a conductor 11, through which a current 12 is sourced. The current 12 produces a magnetic field, B(I) 13 in a direction perpendicular to the current flow. The sensor 10 and conductor 11 may optionally be set at an angle 14 so that the magnetic field 13, is not perpendicular to the sensing direction 15 of the sensor 10.

Figure 2:
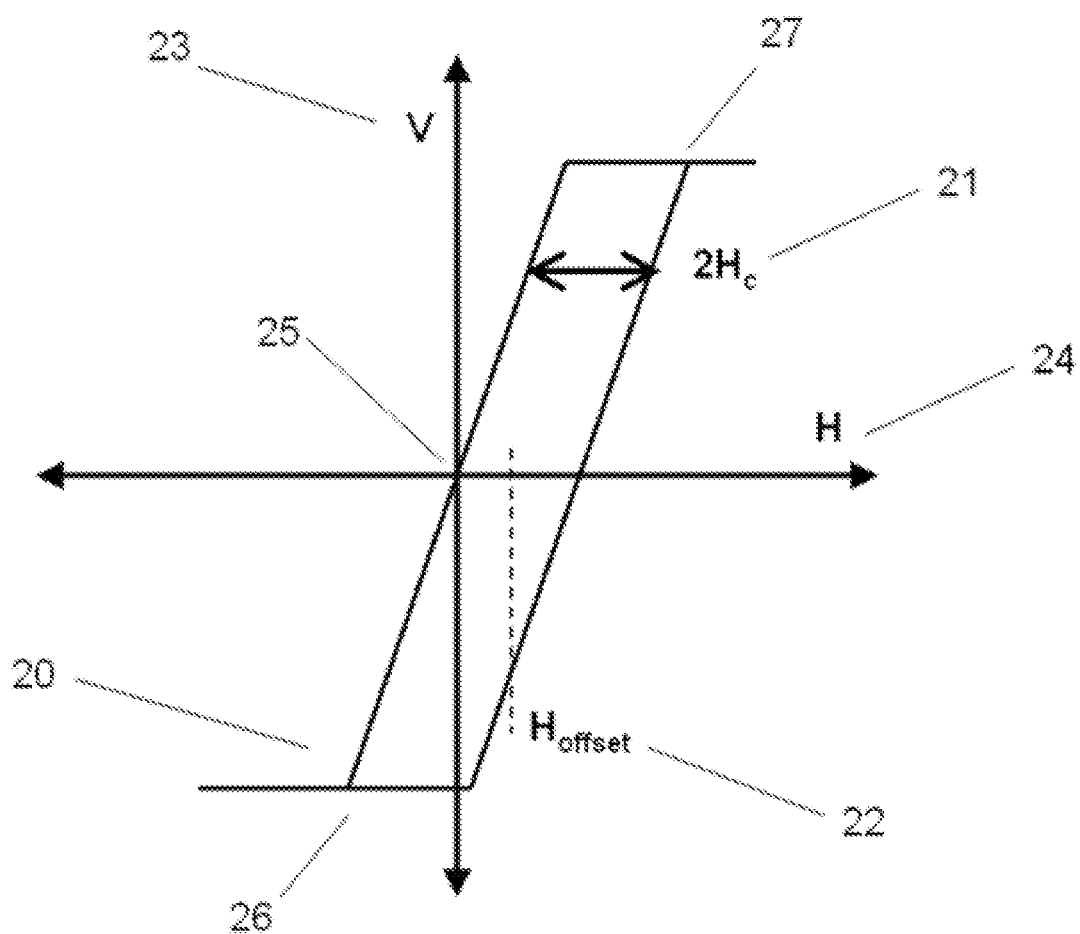
FIG. 2—Definition of magnetic sensor performance metrics.

FIG. 2 depicts a transfer curve 20 for magnetoresistive sensors in order to define the coercivity ($H_c$) 21 and offset ($H_{offset}$) 22 parameters. The transfer curve 20 is a measure of sensor output voltage 23 as a function of applied magnetic field 24. Ideally, sensing is performed on the arm of the transfer curve 20 that passes through the origin of the plot 25. Then provided the sensor is never driven into saturation beyond point 26, the sensor approximates linear response. This is an over simplification, as the sensor will drift with changes in temperature and lower values of field, but provided the sensor is periodically initialized, it can remain on portion 25 of the transfer curve.

A sensor can be operated in this low hysteresis mode if the following condition is met:

$$H_c = H_{offset},\qquad(1)$$

and the devices is periodically saturated using a field along the sensing direction 15 that drives the transfer curve beyond point 27.

Figure 3:
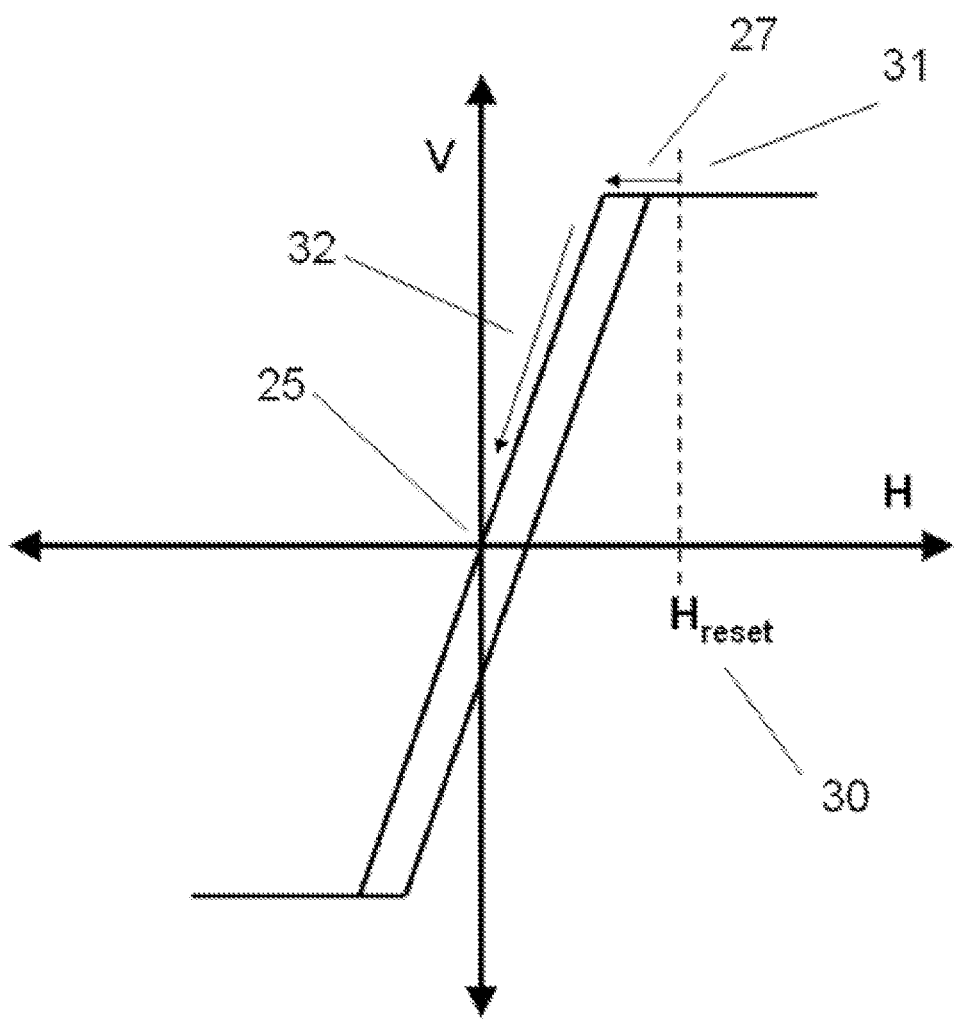
FIG. 3—Explanation of the reset operation.

A simple initialization procedure is shown in FIG. 3. Here, a field value denoted as $H_{reset}$ 30 is applied to the sensor to cause it to go into saturation at a field greater than that associated with point 27 on the transfer curve. Upon removal of $H_{reset}$ 30, the sensor follows path 31-32 and returns to operating point 25. This simple reset procedure would likely be the most power efficient means for removing coercivity, but it may produce better results to use a bipolar pulse sequence, or a multi-shot unipolar pulse sequence, provided the last pulse always supplies a field that saturates the magnetoresistive sensor at field 30 or greater than field 30.

Figure 4:
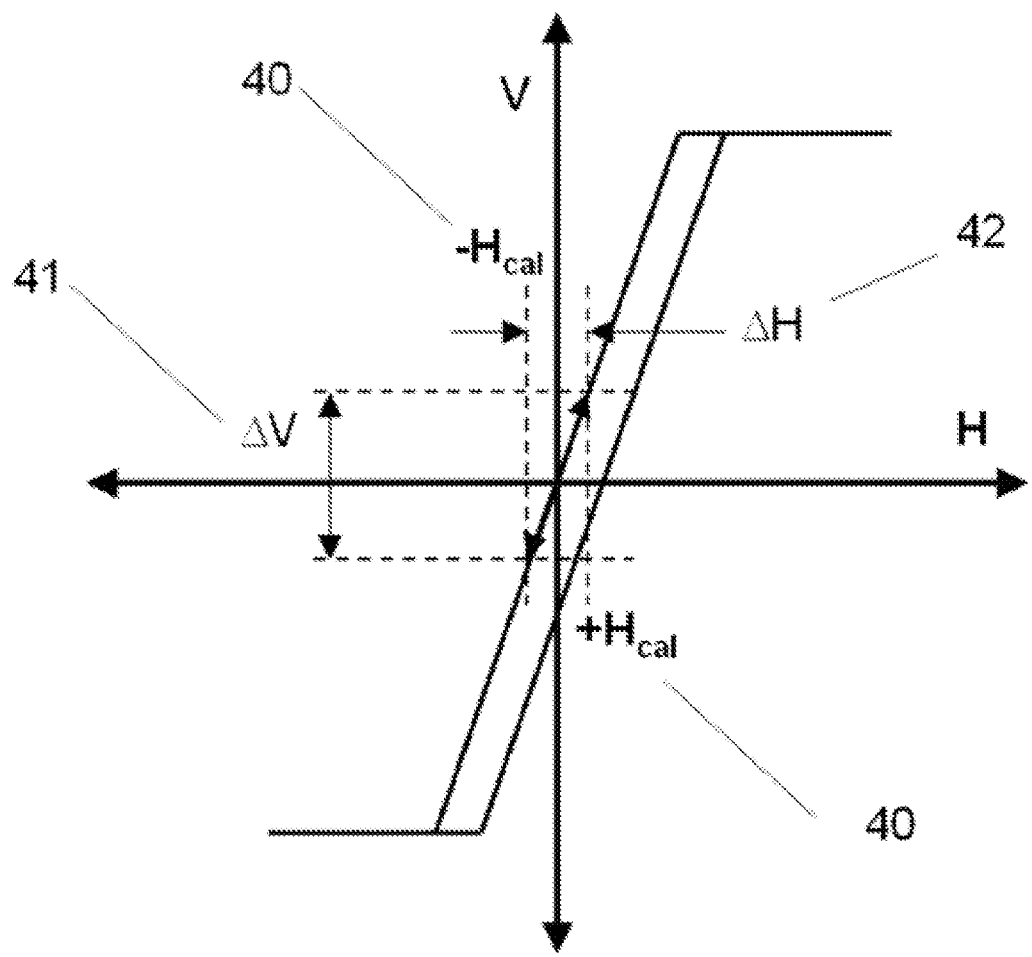
FIG. 4—Explanation of the calibration operation.

After initialization, the device may be calibrated or self-tested during operation as illustrated in FIG. 4. Here, a small calibration pulse is applied through the current conductor to produce a small field $H_{cal}$ 40 collinearly with the sensing axis. The field produces a voltage change in the magnetoresistive sensor $\Delta V$ 41 in response to the known change in the applied magnetic field $\Delta H$ 42, such that the sensitivity may be determined from $$\text{Sensitivity} = \Delta V/\Delta H.\qquad(2)$$

The calibration procedure may be accomplished using a pulse train at some specific frequency or shape such that it is possible to distinguish it from the background signal. The calibration can be performed periodically to remove temperature dependence of the magnetoresistive sensor elements. The pulse train can be unipolar or bipolar, it may be a single pulse, or it may be a continuous square wave or sinusoidal tone.

It is often advantageous to rotate the sensor element 10 by angle $\alpha$ 14 with respect to the coil 11 as illustrated in FIG. 1. The reason for this is illustrated in FIGS. 5 and 6.

Figure 5:
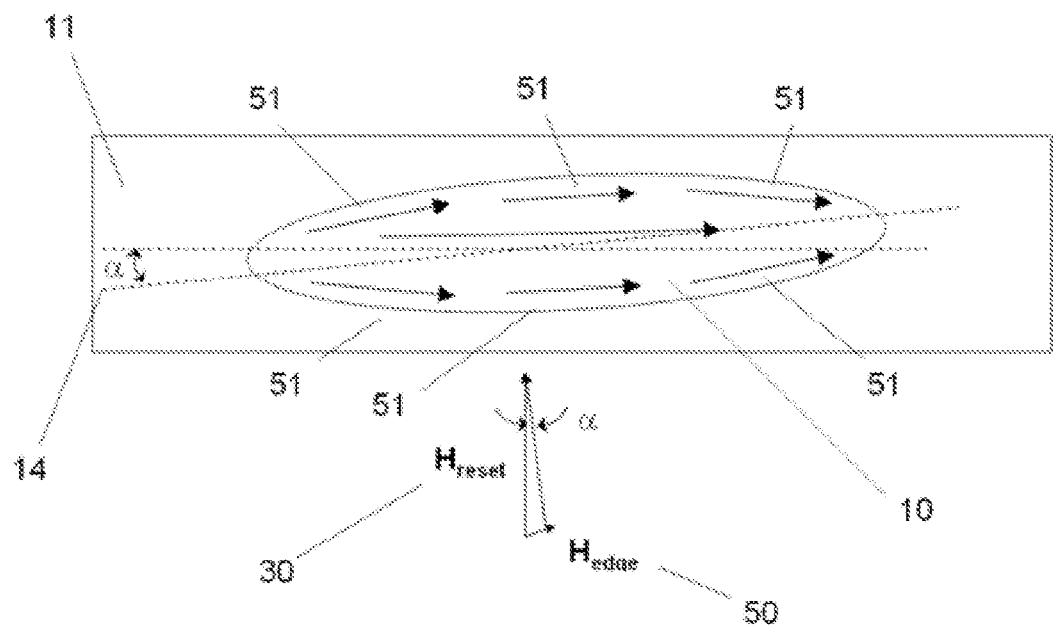
FIG. 5—Edge domains in canted magnetoresistive element.

FIG. 5 shows the case where the sensor element 10 is rotated with respect to the coil 11 by angle $\alpha$ 14. In this configuration, $H_{reset}$ 30 will have a component $H_{edge}$ 51 that is parallel to the edge of the sensor element 10. In the presence of sufficiently large Hedge, the edge domains 51 are forced to align in the same direction, providing a well defined initial state for the magnetization of the magnetoresistive sensor 10. When a first current in the coil is applied, a magnetic reset operation can be performed; when the second current in the coil is applied, a calibration operation is performed. The first current is greater than the second current, and the first and second currents are in the range of 1 to 10 mA.

Figure 6:
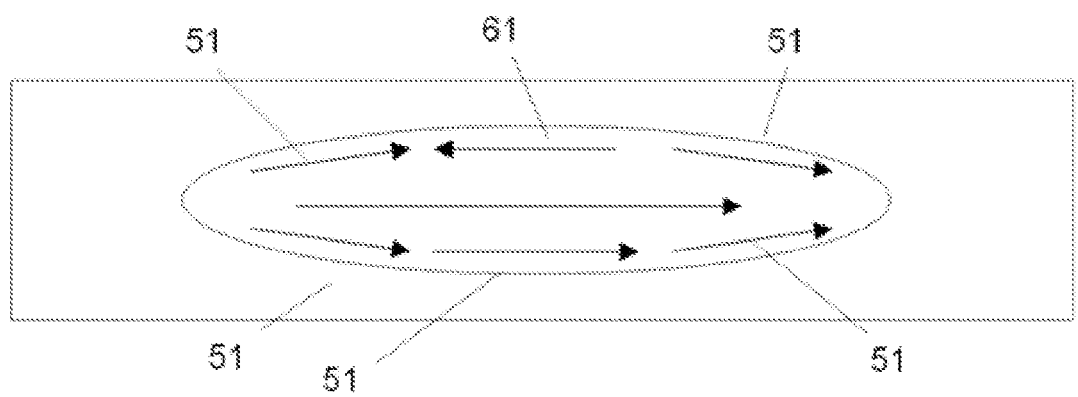
FIG. 6—Edge domains in uncanted magnetoresistive element.

FIG. 6 illustrates a possible edge domain arrangement for a sensor 10—conductor 11 arrangement that does not produce a reset field component $H_{edge}$ 50 parallel to the sensor edge. In this case, there is no driving force to align domains at the edge of the sensor 51, and it is possible for head-to-head domains to form at the edges 61. This is a stochastic process, that makes the device unpredictable, and motion of the domains during operation can produce hysteresis.

The calibration may be corrected as follows:

$$H_{true} \approx H_{cal} \cos(\alpha)\qquad(3)$$

This provides better than 90% accuracy for angles as large as 22.5 degrees. Larger angles can be adjusted for the decrease in sensitivity resulting from the $H_{edge}$ 50 component, if needed. Alternatively, if the sensor is biased using on-chip magnets or in-stack biasing, the $H_{edge}$ component present during calibration may not have any significant influence on the calibration.

Figure 7:
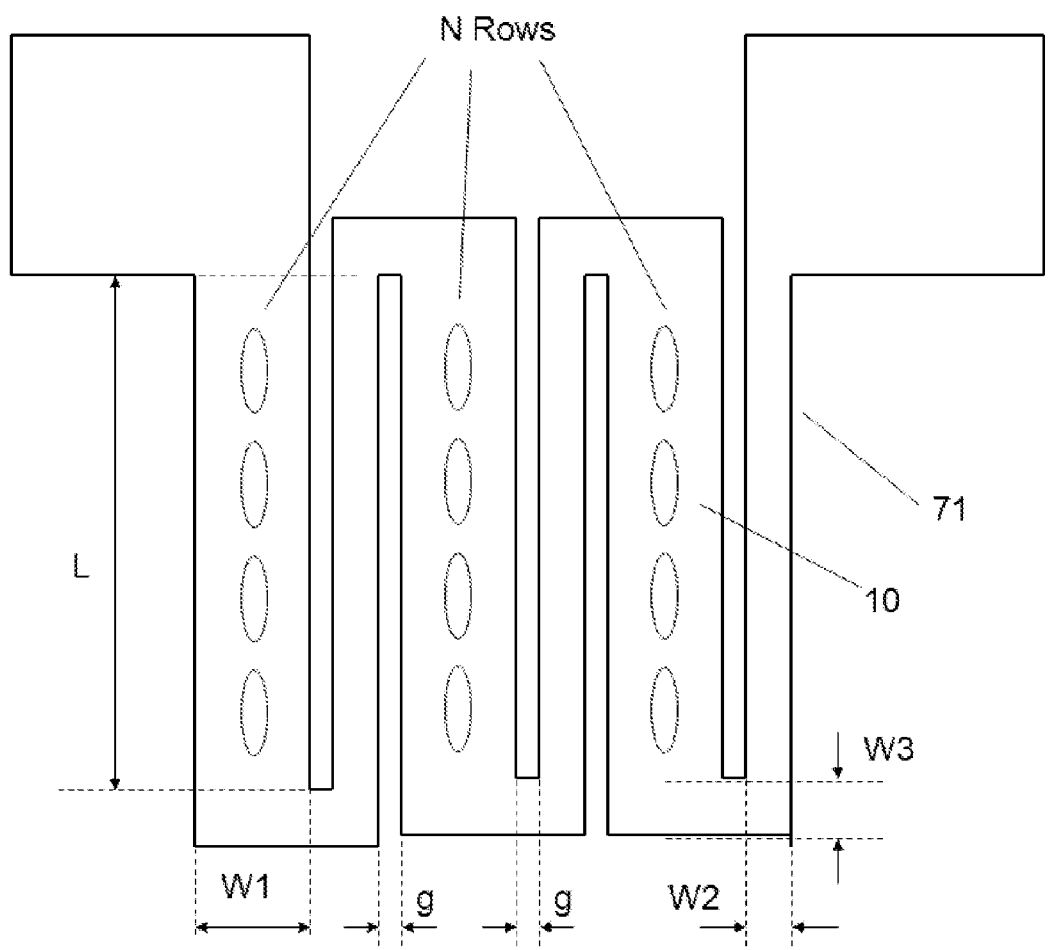
FIG. 7—Schematic drawing of a meander coil geometry that may be used to decrease the size of the magnetometer chip.
Figure 8:
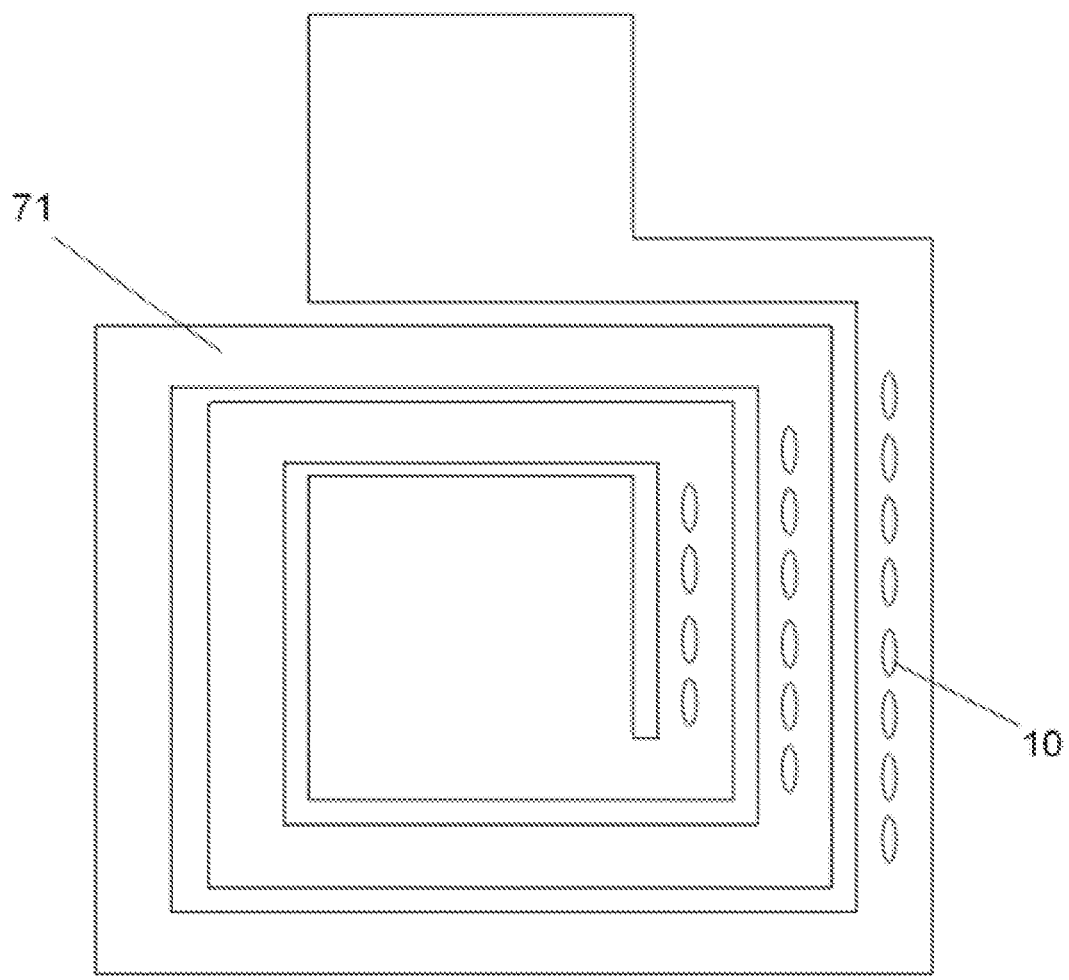
FIG. 8—A schematic drawing of the spiral coil geometry.

A preferred layout for the coil is shown in FIG. 7. The traditional layout is shown in FIG. 8. In the preferred layout, the coil is a meander pattern, with return leads 71 that run between sensor elements 10. This arrangement permits the sensor elements to be more tightly packed than the conventional spiral geometry shown in FIG. 8. A potential issue with the meander coil geometry is high resistance. The resistance of the coil is given as:

$$R(L, W_1, W_2, W_3, t, \rho) \approx \frac{\rho}{t}\left[LN\left(\frac{1}{W_1} + \frac{1}{W_2}\right) + \frac{g(2N-1)}{W_3}\right] \quad (4)$$

If $$\frac{g}{W_3} \approx \frac{L(W_1 + W_2)}{W_1 W_2} \quad (5)$$

Then:

$$R(L, W_1, W_2, W_3, t, \rho) \approx \frac{\rho LN}{t}\left(\frac{1}{W_1} + \frac{1}{W_2}\right) \quad (6)$$

The field produced by the portion of the meander coil that runs atop or beneath the sensor elements is given by:

$$B_x(x, y) = \frac{\mu_0}{4\pi} \frac{I}{tW} \begin{pmatrix} (x - W/2)\left\{\ln\left[\frac{(x-W/2)^2 + y^2}{(x-W/2)^2 + (y+t)^2}\right]\right\} - \\ (x + W/2)\left\{\ln\left[\frac{(x+W/2)^2 + y^2}{(x+W/2)^2 + (y+t)^2}\right]\right\} + \\ 2(y+t)\left\{\text{ATan}\left[\frac{x+W/2}{y+t}\right] - \text{ATan}\left[\frac{x-W/2}{y+t}\right]\right\} - \\ 2y\left\{\text{ATan}\left[\frac{x+W/2}{y}\right] - \text{ATan}\left[\frac{x-W/2}{y}\right]\right\} \end{pmatrix} \quad (7)$$

Here, "W" is the width of the conductor, "t" is the thickness of the conductor, "y" is the height above (or below the surface of the conductor), and "x" is a position along the sensing axis from the center of the conductor.

Note also, $$I_{reset} \leq V_{max}/R(L, W_1, W_2, W_3, t, \rho) \quad (8)$$

Where the geometric parameters are defined in FIG. 7, $\rho$ is the conductivity of the coil material, and $V_{max}$ is the maximum possible voltage the magnetometer system can deliver.

It is apparent that care must be taken such that $H_{reset}$ can be achieved using a voltage that is less than $V_{max}$. Although it is possible to use a switched capacitor scheme to achieve sufficient voltages, it is preferable to keep the voltages in the range of 5 V or smaller. The voltage constraint and coil resistance places restrictions on magnetoresistive element 10 and magnetometer design. They place an upper bound on the achievable $H_{reset}$ and limit the size of the reset coil.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

The invention claimed is:

1. A magnetic field sensor, comprising:
   at least one magnetoresistive sensor element; and
   an electric conductor in the proximity of the magnetoresistive sensor element in order to generate a magnetic field,
   wherein the magnetic field sensor is configured to bias the magnetoresistive sensor element with a magnetic offset field equal to the coercivity of the magnetoresistive sensor element,
   wherein the magnetic field sensor is configured to apply an electric current to the electric conductor to generate a magnetic biasing field parallel to a sensing axis of the magnetoresistive sensor element,
   wherein the magnetic field sensor is configured to apply a first electric current to reset the magnetic field sensor, and apply a second current to calibrate the magnetic field sensor.

2. The magnetic field sensor of claim 1, wherein the first electric current is larger than the second electric current.

3. The magnetic field sensor of claim 1, wherein the first electric current and the second electric current are in the range of 1 mA and 10 mA.

4. The magnetic field sensor of claim 1, wherein the electric conductor is formed from a single conducting layer.

5. The magnetic field sensor of claim 4, wherein the electric conductor is formed into a meander pattern coil, with return leads that run between parallel rows of magnetoresistive sensor elements, and field generating leads that sit atop or beneath the magnetoresistive sensor elements.

6. The magnetic field sensor of claim 4, wherein the electric conductor is patterned into a spiral coil.

7. The magnetic field sensor of claim 1, wherein the magnetic sensor can be used as a solid-state compass.

8. A magnetic field sensor, comprising:
   at least one magnetoresistive sensor element; and
   an electric conductor in the proximity of magnetoresistive sensor element in order to generate a magnetic biasing field,
   wherein the magnetic field sensor is configured to bias the magnetoresistive sensor element with a magnetic offset field equal to the coercivity of the magnetoresistive sensor element,
   wherein the magnetic biasing field has a first magnetic biasing field component parallel to a sensing axis of magnetoresistive sensor element and a second magnetic biasing field component perpendicular to the sensing axis of the magnetoresistive sensor element,
   wherein the first magnetic biasing field component is larger than the second magnetic biasing field component, the first magnetic biasing field component is used for reset and calibration, and the second magnetic biasing field component is used to align magnetic domains at the edges of the magnetoresistive sensor element,
   wherein the first electric current is applied to the electric conductor in order to generate the first magnetic biasing field component and provide a reset function, and a second electric current applied to the electric conductor in order to generate the first magnetic biasing field component and provide a calibration function.

9. The magnetic field sensor of claim 8, wherein the first electric current is larger than the second electric current.

10. The magnetic field sensor of claim 8, wherein the first electric current and the second electric current are in the range of 1 mA and 10 mA.

11. The magnetic field sensor of claim 8, wherein an angle of the central axis of the conductor with respect with a long axis of the magnetoresistive element is $\leq 22.5°$.

12. The magnetic field sensor of claim 8, wherein the electric conductor is formed from a single conducting layer.

13. The magnetic field sensor of claim 12, wherein the electric conductor is formed into a meander pattern coil, with return leads that run between parallel rows of magnetoresistive sensor element and field generating leads that sit atop or beneath the sensor elements.

14. The magnetic field sensor of claim 12, wherein the electric conductor is patterned into a spiral coil.

15. The magnetic field sensor of claim 8, wherein the magnetic sensor can be used as a solid-state compass.

16. The magnetic field sensor of claim 2, wherein the electric conductor is formed from a single conducting layer.

17. The magnetic field sensor of claim 3, wherein the electric conductor is formed from a single conducting layer.

18. The magnetic field sensor of claim 9, wherein the electric conductor is formed from a single conducting layer.

19. The magnetic field sensor of claim 10, wherein the electric conductor is formed from a single conducting layer.

20. The magnetic field sensor of claim 11, wherein the electric conductor is formed from a single conducting layer.

* * * * *

UNITED STATES PATENT AND TRADEMARK OFFICE
CERTIFICATE OF CORRECTION

PATENT NO. : 9,599,693 B2
APPLICATION NO. : 14/356603
DATED : March 21, 2017
INVENTOR(S) : Deak et al.

It is certified that error appears in the above-identified patent and that said Letters Patent is hereby corrected as shown below:

On the Title Page

In item (71), in "Applicant", in Column 1, Line 2, after "Zhangjiagang", insert --, Jiangsu--

In item (72), in "Inventors", in Column 1, Line 1, after "Zhangjiagang", insert --, Jiangsu--

In item (72), in "Inventors", in Column 1, Line 2, after "Zhangjiagang", insert --, Jiangsu--

In item (72), in "Inventors", in Column 1, Line 3, after "Zhangjiagang", insert --, Jiangsu--

In item (72), in "Inventors", in Column 1, Line 4, after "Zhangjiagang", insert --, Jiangsu--

In item (73), in "Assignee", in Column 1, Line 2, delete "Zhangjiagang Jiangsu" and insert --Zhangjiagang, Jiangsu-- therefor In item (30), in "Foreign Application Priority Data", in Column 1, Line 1, delete "2011 1 0356226" and insert --201110356226.1-- therefor Signed and Sealed this
Twenty-fourth Day of April, 2018

Andrei Iancu
*Director of the United States Patent and Trademark Office*